(12) United States Patent
Lee et al.

(10) Patent No.: US 10,062,546 B2
(45) Date of Patent: Aug. 28, 2018

(54) SAMPLE HOLDER AND FOCUSED-ION-BEAM MACHINING DEVICE PROVIDED THEREWITH

(71) Applicant: Hitachi, Ltd., Tokyo (JP)

(72) Inventors: Noriyuki Lee, Tokyo (JP); Hiroyuki Yamamoto, Tokyo (JP); Akira Sugawara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 283 days.

(21) Appl. No.: 14/890,258

(22) PCT Filed: May 14, 2013

(86) PCT No.: PCT/JP2013/063458
§ 371 (c)(1),
(2) Date: Mar. 2, 2016

(87) PCT Pub. No.: WO2014/184881
PCT Pub. Date: Nov. 20, 2014

(65) Prior Publication Data
US 2016/0172158 A1 Jun. 16, 2016

(51) Int. Cl.
*H01L 37/00* (2006.01)
*H01J 37/305* (2006.01)
*H01J 37/317* (2006.01)

(52) U.S. Cl.
CPC ........ *H01J 37/3056* (2013.01); *H01J 37/317* (2013.01); *H01J 2237/31749* (2013.01)

(58) Field of Classification Search
CPC ................ H01J 37/3056; H01J 37/317; H01J 2237/31749
USPC ........................................... 250/492.1–492.3
See application file for complete search history.

(56) References Cited

U.S. PATENT DOCUMENTS

| | | | | |
|---|---|---|---|---|
| 3,993,509 A | * | 11/1976 | McGinty | H01J 37/317 250/492.2 |
| 5,783,830 A | * | 7/1998 | Hirose | H01J 37/3056 250/442.11 |
| 2012/0001086 A1 | * | 1/2012 | Ogawa | H01J 37/12 250/396 R |

FOREIGN PATENT DOCUMENTS

| JP | 2006-302785 A | 11/2006 |
|---|---|---|
| JP | 2012-033467 A | 2/2012 |

OTHER PUBLICATIONS

International Search Report of PCT/JP2013/063458.

\* cited by examiner

*Primary Examiner* — Michael Maskell
(74) *Attorney, Agent, or Firm* — Mattingly & Malur, PC

(57) ABSTRACT

To realize a focused-ion-beam machining apparatus capable of machining a thin sample with a wide area and a uniform film thickness and a needle-like sample with a sharp tip, in a focused-ion-beam machining apparatus including: an ion source (1); an electronic lens (3) focusing an ion beam extracted from the ion source (1) and irradiating the ion beam to a sample (5); and a sample holder (13) holding the sample (5), the sample holder (13) is provided with a shield electrode (7) arranged in a manner such as to cover the sample (5), and the sample (5) and the shield electrode (7) are insulated from each other in a manner such that voltages can be applied to them separately from each other.

13 Claims, 5 Drawing Sheets

SAMPLE HOLDER AND FOCUSED-ION-BEAM MACHINING DEVICE PROVIDED THEREWITH

TECHNICAL FIELD

The present invention relates to a sample holder and a focused-ion-beam (FIB) machining apparatus provided therewith.

BACKGROUND ART

The FIB machining observation apparatus is an apparatus which performs sample microfabrication by focusing an ion beam and irradiating it to a sample (Patent Literature 1 and 2). The ion irradiation to the sample permits sample sharpening through spattering. Through detection of a secondary electron simultaneously emitted from the sample, a scanning ion microscope (SIM) image can be obtained. That is, since sample machining and observation can be performed in parallel, it is suitable for performing microfabrication at a specified place of the sample. Thus, it is used for defect analysis of a semiconductor and fabrication of a thin sample and a needle-like sample for a transmission electron microscope. Further, in case of a multifunction apparatus (FIB-SEM) combining an focused-ion-beam machining observation apparatus and a scanning electron microscope (SEM), machining with an FIB and accurate observation based on the SEM image can be performed in parallel, making it possible to machine a sample with a fine structure which cannot be observed on the SIM image.

CITATION LIST

Patent Literature

PTL 1: Japanese Patent Application Laid-open No. 2006-302785
PTL 2: Japanese Patent Application Laid-open No. 2012-33467

SUMMARY OF INVENTION

Technical Problem

The use of an ion beam permits microfabrication but the ion beam has a certain width even when focused, and thus there is limitation on accuracy of a shape that can be fabricated through the machining. As a result of study by the inventors, it has been found that, to fabricate a thin sample with a dimension of 10 μm×10 μm and a thickness of approximately 100 nm, it is difficult to provide a uniform film thickness with such a wide area. It has also been found that, to fabricate a needle-like sample, a tip cannot be more sharpened than a certain level.

It is an object of the invention to provide a sample holder and a focused-ion-beam machining apparatus provided therewith capable of fabricating a thin sample with a wide area and a uniform film thickness and a needle-like sample with a sharp tip.

Solution to Problem

As one embodiment to address the object described above, in a sample holder for use in a focused-ion-beam machining apparatus, provided is a shield electrode arranged in a manner such as to cover a sample, and the sample and the shield electrode are electrically insulated from each other in a manner such that voltages can be applied to the sample and the shield electrode separately from each other.

Moreover, in a focused-ion-beam machining apparatus including: an ion source; an electronic lens focusing an ion beam extracted from the ion source and irradiating the ion beam to a sample; and a sample holder holding the sample, the sample holder has a shield electrode arranged in a manner such as to cover the sample, and the sample and the shield electrode are electrically insulated from each other in a manner such that voltages can be applied to the sample and the shield electrode separately from each other.

Advantageous Effects of Invention

The invention can provide a sample holder and a focused-ion-beam machining apparatus provided therewith capable of fabricating a thin sample with a wide area and a uniform film thickness and a needle-like sample with a sharp tip.

DESCRIPTION OF EMBODIMENTS

An FIB machining observation apparatus of the present invention includes a shield electrode covering a sample. The shield electrode is electrically insulated from the sample, and voltages can be applied to the sample and the shield electrode separately from each other. A potential difference between the sample and the shield electrode forms an electric field. The electric field is closed between the sample and the shield electrode, and thus a decrease in a distance between the sample and the shield electrode can form a large electric field. Moreover, adjustment of a position and inclination of the shield electrode from an outside of the FIB machining observation apparatus can adjust a shape of the electric field. By the electric field formed as described above, deflection of an ion beam can be controlled to perform machining with a high degree of freedom.

Hereinafter, the invention will be described with reference to embodiments.

(First Embodiment)

Figure 1:
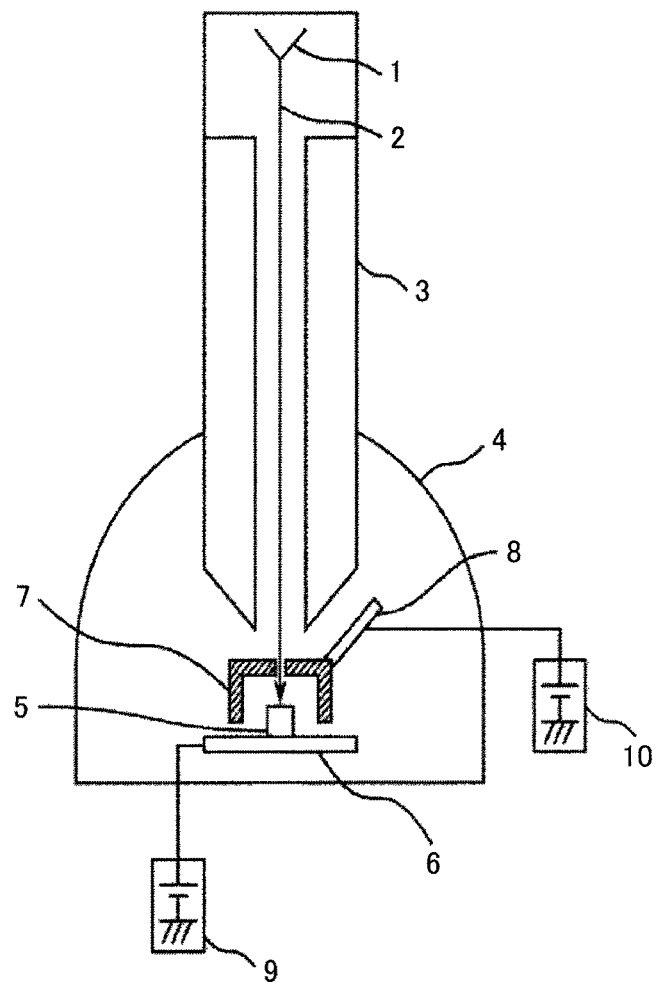
FIG. 1 is a sectional view of schematic overall configuration illustrating an FIB machining observation apparatus according to a first embodiment of the present invention.

A sample holder and a focused-ion-beam (FIB) machining observation apparatus provided therewith according to a first embodiment of the present invention will be described with reference to the drawings. Illustrated in this embodiment is configuration for machining a thin sample. FIG. 1 shows overall configuration of the FIB machining observation apparatus. A gallium ion is extracted from an ion source 1 at a top of the apparatus, turning into an ion beam 2 and traveling towards a bottom part of the apparatus. The ion beam 2 is subjected to controls such as focusing and deflection performed by an electronic lens 3 and is irradiated to a sample 5 placed in a sample chamber 4 which is kept vacuum. The sample 5 is fixed at a sample stage 6. The sample stage 6 is electrically connected to an external power supply 9, and thus a voltage can be applied to the sample 5 by the external power supply 9. The sample 5 is covered with a shield electrode 7. The shield electrode 7 is fixed by a microprobe 8 of a movable type. The microprobe is movable and can adjust a position with respect to the sample 5. The microprobe is electrically connected to an external power supply 10, and thus a voltage can be applied to the electrode 7 by the external power supply 10. The sample holder includes the sample stage 6 and the shield electrode 7.

Figure 2:
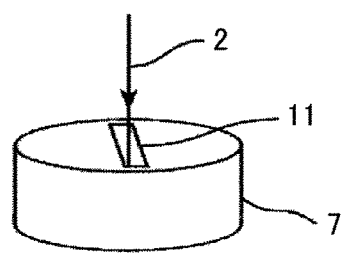
FIG. 2 is a perspective view illustrating a substantial part (shield electrode) of a sample holder according to the first embodiment of the invention.

FIG. 2 shows a shape of the shield electrode 7 forming the sample holder. The shield electrode 7 has a circular shape with a diameter of 5 mm, which is sufficiently larger than the sample. The shield electrode 7 has a cylindrical cover at its side surface part to close an electric field therein (between the sample 5 and the shield electrode 7). Provided at a top part thereof is a punched hole 11, through which the ion beam 2 is irradiated to the sample covered with the shield electrode 7. The punched hole 11 has a slit shape with a width of 1 mm and a length of 3 mm. These width and length are sufficiently larger than those of a machined sample (approximately 100 nm to 10 μm). Thus, a size of the punched hole does not influence a thickness of a thin film after the machining.

Figure 3:
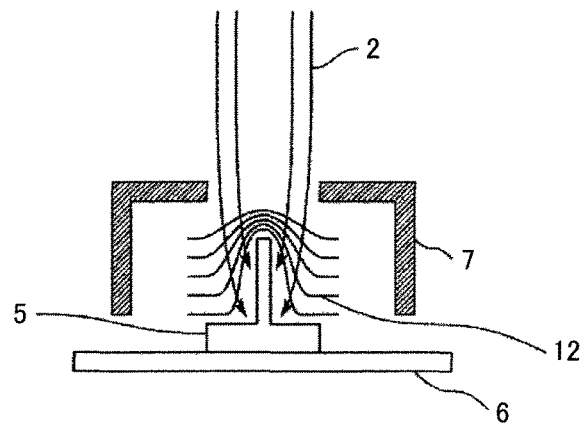
FIG. 3 is a sectional view illustrating how a sample is machined in the sample holder of the FIB machining observation apparatus according to the first embodiment of the invention.

Machining procedures for machining the sample 5 loaded on the sample stage 6 into a flat plate will be described with reference to FIG. 3. While observing the sample on an SIM image, horizontal and vertical orientations of the shield electrode 7 are adjusted so that a section to be machined can be viewed through a center of the punched hole. Sample observation can be performed by detecting, with a secondary electron detector (not shown) arranged on a top part of the shield electrode 7, a secondary electron (not shown) discharged from the sample 5 and popped out of the hole through the irradiation of the ion beam 2. Next, a height of the shield electrode 7 is adjusted by the microprobe 8 while matching a focus of an SIM image with the sample 5 and the shield electrode 7 alternately to approach the sample 5 as closely as possible.

First, as is with a conventional case, while the voltages of the shield electrode 7 and the sample 5 are kept at 0 V, a wall-type thin sample with a width of 10 μm and a height of 10 μm is fabricated through FIB machining in a manner such that the ion beam 2 is vertically irradiated to a surface of the sample 5. With this FIB machining, a thickness of a bottom part of the sample 5 is larger than that of a top part thereof (a trapezoidal shape), resulting in failure to obtain a thin sample with a uniform film thickness. Thus, in this embodiment, a potential difference is provided between the shield electrode 7 and the sample 5.

Specifically, upon reach of a final finishing stage, while the voltage of the shield electrode 7 is kept at 0 V, a negative voltage is gradually applied to the sample 5. As a result, an electric field expressed by an equipotential surface 12 is formed between the sample 5 and the shield electrode 7. Inclination of the shield electrode 7 with respect to the sample 5 moves the SIM image, and thus the inclination of the shield electrode 7 is adjusted as appropriate so as to avoid the movement. Upon reach of the voltage applied to the sample 5 at −100 V, a positively-charged ion beam is pulled to the sample 5 by the electric field, and a base of the thin sample is viewed to be widening on the SIM image. At this point, the ion beam 2 is uniformly irradiated to the top part and the bottom part of the sample 5, permitting machining of the thin sample with a uniform film thickness. Although it is also possible to apply a positive voltage to the shield electrode 7 while the voltage of the sample 5 is kept at 0 V (a grounding potential), in view of relation to a potential of an electronic lens, it is preferable that the shield electrode have the grounding potential (0 V). In this embodiment, the gallium ion is used as an ion, although not limited thereto.

A role of the shield electrode 7 is passing the ion beam 2 therethrough and closing the electrical field between the shield electrode 7 and the sample 5. Therefore, unless the shield electrode 7 leaks the electrical field to the top part, shapes of the shield electrode 7 and the punched hole 11 may be different from those described above.

As described above, with this embodiment described above, the ion beam can be bent and irradiated to the sample inside of the shield electrode, thus making it possible to provide a sample holder and a focused-ion-beam machining apparatus provided therewith capable of fabricating a thin sample with a wide area and a uniform thickness.

(Second Embodiment)

A second embodiment of the invention will be described with reference to FIGS. 4 and 5. In this embodiment, fabrication of a needle-like sample with a sharp tip will be described. Configuration of the apparatus as a whole is the same as that of the first embodiment.

Figure 4:
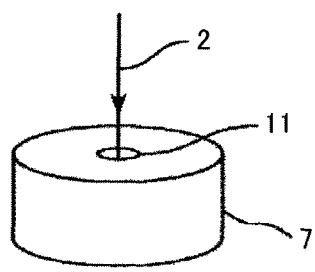
FIG. 4 is a perspective view illustrating a substantial part (shield electrode) of a sample holder according to a second embodiment of the invention.
Figure 5:
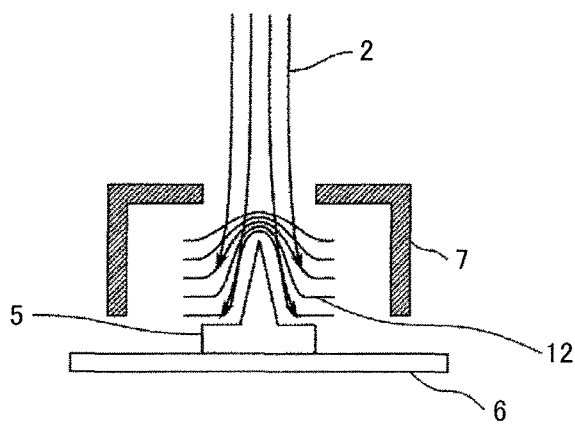
FIG. 5 is a sectional view illustrating how a sample is machined in the sample holder of an FIB machining observation apparatus according to the second embodiment of the invention.

FIG. 4 is a perspective view of a shield electrode 7 in a sample holder according to this embodiment. The shield electrode 7 has a circular shape with a diameter of 5 mm, which is sufficiently larger than a sample. The shield electrode 7 has a cylindrical cover at its side surface part to close an electrical field therein (between the sample 5 and the shield electrode 7). Provided at a top part thereof is a punched hole 11, through which an ion beam 2 is irradiated to the sample covered with the shield electrode 7. The punched hole 11 has a circular or polygonal shape with a diameter of 1 mm.

Machining procedures for machining the sample 5 loaded on a sample stage 6 into a needle-like shape with a sharp tip will be described with reference to FIG. 5. While observing the sample on an SIM image, horizontal and vertical orientations of the shield electrode 7 are adjusted in a manner such that a section to be machined can be viewed through a center of the punched hole. Sample observation can be performed by detecting, with a secondary electron detector (not shown) arranged on the top part of the shield electrode 7, a secondary electron (not shown) discharged from the sample 5 and popped out from the punched hole through the irradiation of the ion beam 2. Next, a height of the shield electrode 7 is adjusted by a microprobe 8 while matching a focus of the SIM image with the sample 5 and the shield electrode 7 alternately to approach the sample 5 as closely as possible.

First, as is with a conventional case, while voltages of the shield electrode 7 and the sample 5 are kept at 0 V, a needle-like sample is fabricated through FIB machining in a manner such that the ion beam 2 is vertically irradiated to a surface of the sample 5. With this machining based on the FIB, the needle-like sample in which a top part of the sample 5 is round and its tip is sharp cannot be obtained. Thus, in this embodiment, a potential difference is provided between the shield electrode 7 and the sample 5.

Specifically, upon reach of a final finishing stage, while the voltage of the shield electrode 7 is kept at 0 V, a positive voltage is gradually applied to the sample 5. As a result, an electric field expressed by an equipotential surface 12 is formed between the sample 5 and the shield electrode 7. Inclination of the shield electrode 7 with respect to the sample 5 moves the SIM mage, and thus the inclination of the shield electrode 7 is adjusted as appropriate so as to avoid the movement. Upon reach of the voltage applied to the sample 5 at +100 V, the positively-charged gallium ion beam is moved further from the sample 5 by the electric field, and the tip of the needle-like sample is viewed to be shrinking on the SIM image. At this point, the ion beam 2 is preferentially irradiated to places other than the tip of the sample 5, permitting machining of the needle-like sample with a sharp tip. Note that it is also possible to apply a negative voltage to the shield electrode 7 while the voltage of the sample 5 is kept at 0 V (a ground potential), but in view of relation to a potential of an electronic lens, it is desirable that the shield electrode 7 have the ground potential (0 V). In this embodiment, the gallium ion is used as an ion, although not limited thereto.

A role of the shield electrode 7 is passing the ion beam 2 therethrough and closing the electric field between the shield electrode 7 and the sample 5. Therefore, unless the shield electrode 7 leaks the electric field to the top part, shapes of the shield electrode 7 and the punched hole 11 may be different from those described above.

As described above, with this embodiment, the ion beam can be bent and irradiated to the sample inside of the shield electrode, thus making it possible to provide a sample holder and a focused-ion-beam machining apparatus provided therewith capable of fabricating a needle-like sample with a sharp tip.

(Third Embodiment)

Figure 6:
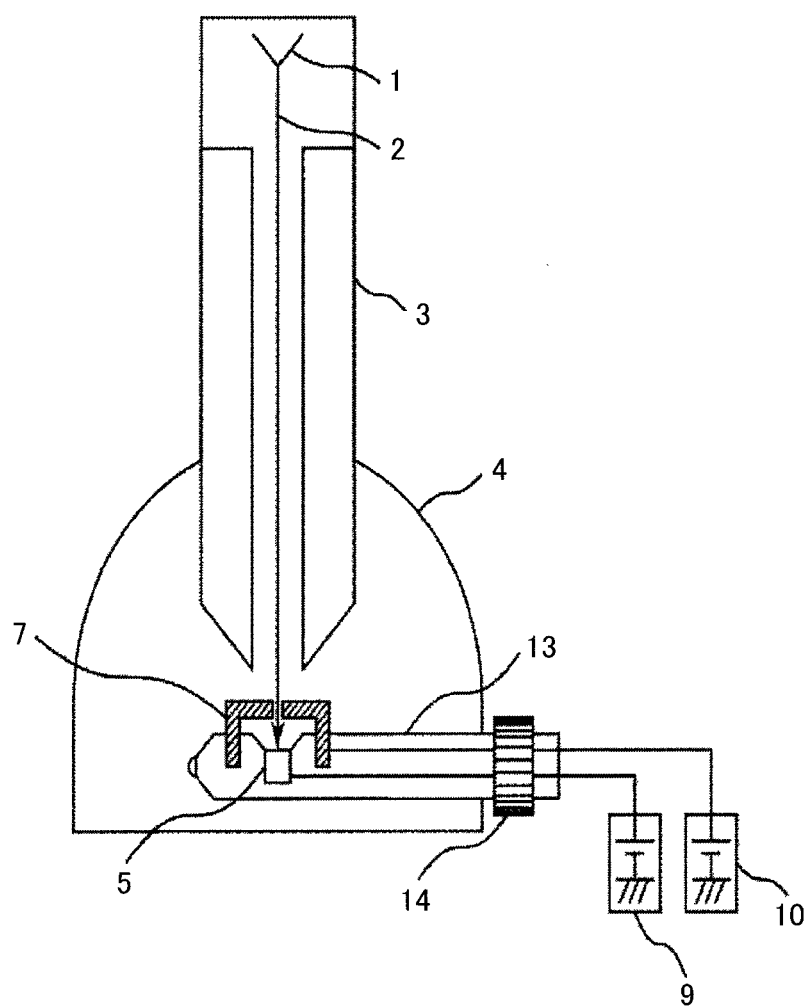
FIG. 6 is a sectional view of schematic overall configuration illustrating an FIB machining observation apparatus and a sample holder according to a third embodiment of the invention.

A third embodiment of the invention will be described with reference to FIGS. 6 and 9. Note that those described in the first and second embodiments but not described in this embodiment can also be applied to this embodiment unless otherwise specified.

In this embodiment, details of a sample holder will be described. FIG. 6 shows configuration of an FIB machining observation apparatus as a whole and the sample holder according to this embodiment. A liquid metal gallium ion is extracted from an ion source 1 on a top part of the apparatus, turning into an ion beam 2 and travelling towards a bottom part of the apparatus. The ion beam 2 is subjected to controls such as focusing and deflection performed by an electronic lens 3, and is irradiated to a sample 5 located in a sample chamber 4 which is kept vacuum. The sample 5 is fixed at the sample holder 13. The sample holder 13 is of a side entry shape whose one end is fitted to the sample 5 and whose another end is exposed to an outside of the sample chamber 4. The sample 5 is covered with the shield electrode 7. A gap is formed between the shield electrode 7 and a main body of the sample holder 13 so that a degree of vacuum therebetween is at the same level as that of the sample chamber 4 even during the machining.

Figure 9:
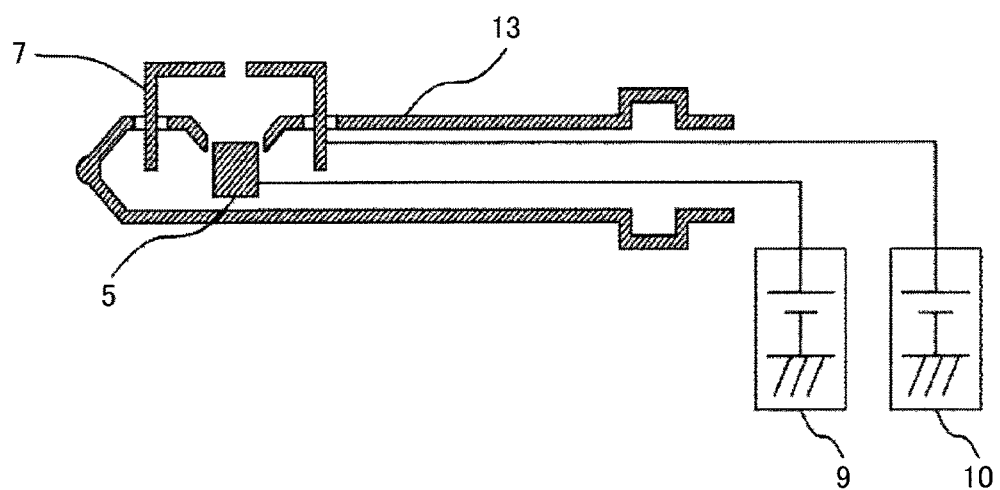
FIG. 9 is a detailed sectional view of the sample holder according to the third embodiment of the invention.

FIG. 9 shows a sectional view of the sample holder 13. The sample 5 and the shield electrode 7 are electrically insulated from the main body of the sample holder 13. The main body of the sample holder 13 is formed of metal and has a hollow inside, in which electric wires can be arranged. The sample 5 is connected to an external power supply 9 through the electric wire inside of the main body of the sample holder 13, thus permitting voltage application to the sample 5 by the external power supply 9. The shield electrode 7 is connected to an external power supply 10 through the electric wire inside of the main body of the sample holder 13, thus permitting voltage application to the shield electrode 7 by the external power supply 10. The shield electrode 7 can adjust its position and inclination with respect to the sample 5 by moving an adjusting knob 14.

Then, position adjustment of the shield electrode 7 and machining procedures are performed in the same manner as in the first and second embodiments, which permits machining the same thin sample and needle-like sample as those of the first and second embodiments.

As described above, with this embodiment, the ion beam can be bend and irradiated to the sample inside of the shield electrode, and thus it is possible to provide a sample holder and a focused-ion-beam machining apparatus provided therewith capable of fabricating a thin sample with a wide area and a uniform film thickness and a needle-like sample with a sharp tip. Moreover, the sample holder can be of the side entry shape, thereby permitting easy fabrication of the sample holder provided with the shield electrode. Moreover, the shield electrode and the sample are electrically insulated from the main body of the sample holder and the power supplies connecting them are provided separately from each other, thereby permitting application of given voltages to them with respect to the sample holder, which makes it possible to bend the ion beam incident on the sample in a desired direction and permits machining with a higher degree of freedom.

(Fourth Embodiment)

Figure 7:
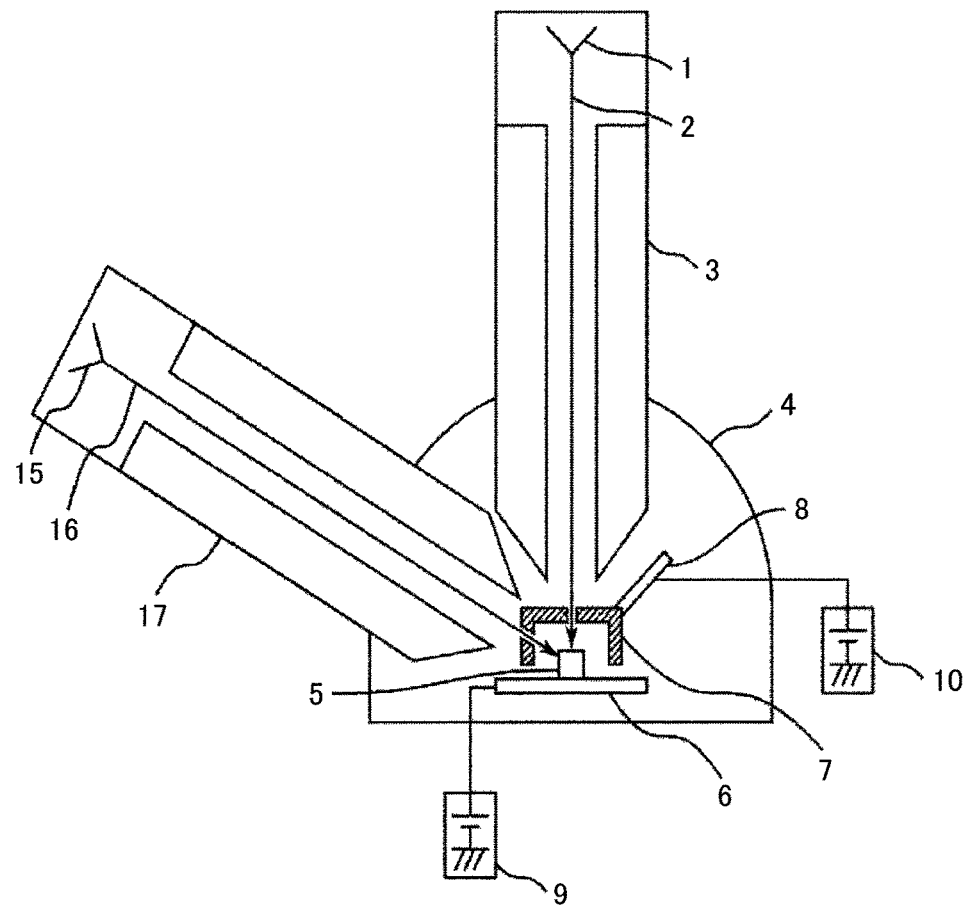
FIG. 7 is a sectional view of schematic overall configuration illustrating an FIB-SEM machining observation apparatus according to a fourth embodiment of the invention.

A fourth embodiment of the invention will be described with reference to FIGS. 7 and 8. Those described in the first to third embodiments but not described in this embodiment can also be applied to this embodiment unless otherwise specified.

Described in this embodiment is an FIB-SEM machining observation apparatus. FIG. 7 shows a sectional view of overall configuration of the FIB-SEM machining observation apparatus according to this embodiment. A liquid metal gallium ion is extracted from an ion source 1 at a top part of the apparatus, turning into an ion beam 2 and travelling to a bottom part of the apparatus. The ion beam 2 is subjected to controls such as focusing and deflection performed by an electronic lens 3, is irradiated to a sample 5 located in a sample chamber 4 which is kept vacuum, and the sample is machined.

In contrast, an electron is extracted from an electron beam source 15, turning into an electron beam 16 and travelling towards the bottom part of the apparatus. The electron beam 16 is subjected to controls such as focusing and deflection performed by an electronic lens 17, is irradiated to the sample 5 located in the sample chamber 4 which is held vacuum, and the sample is observed.

Figure 8:
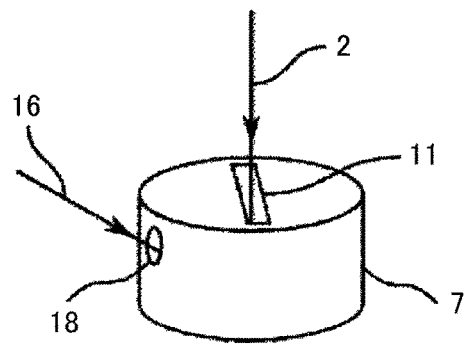
FIG. 8 is a perspective view illustrating a substantial part (shield electrode) of a sample holder according to the fourth embodiment of the invention.

FIG. 8 shows a perspective view of a sample holder and a shield electrode 7 (for thin film formation) provided therewith according to this embodiment. In addition to a punched hole 11 for passing the ion beam 2 therethrough, a punched hole 18 for passing the electron beam 16 therethrough is provided. Setting voltages applied to the shield electrode 7 and the sample 5 at 0 V permits observation of the sample 5 in processing on a SEM image in the same manner as in a case where no shield electrode 7 is provided.

Then, position adjustment and machining procedures of the shield electrode 7 are performed in the same manner as in the first and second embodiments, which permits machining of the same thin sample and needle-like sample as those of the first and second embodiments. Moreover, providing the punched hole 18 at the shield electrode 7 of the third embodiment permits use of the sample holder 13 for the FIB-SEM machining observation apparatus.

As described above, the ion beam can be bent and irradiated to the sample inside of the shield electrode, thus making it possible to provide a sample holder and a focused-ion-beam machining apparatus provided therewith capable of fabricating a thin sample with a wide area and a uniform film thickness and a needle-like sample with a sharp tip. Moreover, loading an SEM function permits observation of a shape in machining with high accuracy, and permits machining with even higher accuracy.

The invention is not limited to the embodiments described above, and includes various modified embodiments. For example, the embodiments above are described in detail for easier understanding of the invention, and thus the invention is not necessarily limited to the one including all the configurations described. Moreover, part of the configuration of one of the embodiments can be replaced with the configuration of another one of the embodiments, and the configuration of one of the embodiments can be added to the configuration of another one of the embodiments. Moreover, for part of the configuration of each embodiment, addition, deletion, and replacement of the configuration of another one of the embodiments are possible.

REFERENCE SINGS LIST

1 . . . Ion source,
2 . . . Ion beam,
3 . . . Electronic lens,
4 . . . Sample chamber,
5 . . . Sample,
6 . . . Sample stage,
7 . . . Shield electrode,
8 . . . Microprobe,
9 . . . External power supply,
10 . . . External power supply,
11 . . . Punched hole,
12 . . . Equipotential surface,
13 . . . Sample holder,
14 . . . Adjusting knob,
15 . . . Electron beam source,
16 . . . Electron beam,
17 . . . Electronic lens,
18 . . . Punched hole.

The invention claimed is:

1. A focused-ion-beam machining apparatus comprising:
an ion source;
a first electronic lens configured to focus an ion beam extracted from the ion source and irradiate the ion beam to a sample;
a sample holder configured to hold the sample;
a shield electrode configured to cover the sample;
a sample chamber in which the sample holder, the sample, and the shield electrode are disposed;
a microprobe disposed in the sample chamber and configured to adjust a position of the shield electrode from an outside of the sample chamber;
a first power supply electrically connected to the sample holder; and
a second power supply electrically connected to the shield electrode,
wherein the sample and the shield electrode are electrically insulated from each other, the first power supply is configured to apply a voltage to the sample via the sample holder, and the second power supply is configured to apply a voltage to the shield electrode separately from the first power supply, and
wherein the shield electrode is separated from the sample holder by a gap.

2. The focused-ion-beam machining apparatus according to claim 1,
wherein the shield electrode has a cylindrical shape with an upper surface which defines a slit-shaped hole through which the ion beam passes.

3. The focused-ion-beam machining apparatus according to claim 2,
wherein the voltage applied by the first power supply to the sample holder is set lower than the voltage applied by the second power supply to the shield electrode.

4. The focused-ion-beam machining apparatus according to claim 1,
wherein the shield electrode has a cylindrical shape with an upper surface which defines a circular hole through which the ion beam passes.

5. The focused-ion-beam machining apparatus according to claim 4,
wherein the voltage applied by the first power supply to the sample holder is set higher than the voltage applied by the second power supply to the shield electrode.

6. The focused-ion-beam machining apparatus according to claim 1, further comprising:
an electron beam source; and
a second electronic lens focusing an electron beam extracted from the electron beam source and irradiating the electron beam to the sample.

7. The focused-ion-beam machining apparatus according to claim 1,
wherein the shield electrode is configured to close an electrical field between the shield electrode and the sample.

8. A focused-ion-beam machining apparatus comprising:
an ion source;
a first electronic lens configured to focus an ion beam extracted from the ion source and irradiate the ion beam to a sample;
a sample holder configured to hold the sample;
a shield electrode configured to cover the sample;
a first power supply electrically connected to the sample holder; and
a second power supply electrically connected to the shield electrode,
wherein the sample and the shield electrode are electrically insulated from each other, the first power supply is configured to apply a voltage to the sample via the sample holder, and the second power supply is configured to apply a voltage to the shield electrode separately from the first power supply, and
wherein the voltage applied by the first power supply to the sample holder is set lower than the voltage applied by the second power supply to the shield electrode.

9. The focused-ion-beam machining apparatus according to claim 8,
wherein the shield electrode has a cylindrical shape with an upper surface which defines a slit-shaped hole through which the ion beam passes.

10. The focused-ion-beam machining apparatus according to claim 8,
wherein the shield electrode has a cylindrical shape with an upper surface which defines a circular hole through which the ion beam passes.

11. The focused-ion-beam machining apparatus according to claim 8,
wherein the voltage applied by the first power supply to the sample holder is set higher than the voltage applied by the second power supply to the shield electrode.

12. The focused-ion-beam machining apparatus according to claim 8, further comprising:
an electron beam source; and
a second electronic lens focusing an electron beam extracted from the electron beam source and irradiating the electron beam to the sample.

13. The focused-ion-beam machining apparatus according to claim 8,
wherein the shield electrode is configured to close an electrical field between the shield electrode and the sample.

* * * * *